United States Patent [19]
Streckfuss et al.

[11] Patent Number: 6,145,733
[45] Date of Patent: Nov. 14, 2000

[54] PROCESS FOR SOLDERING ELECTRONIC COMPONENTS TO A PRINTED CIRCUIT BOARD

[75] Inventors: Herbert Streckfuss, Karlsruhe; Volker Liedke, Leimersheim, both of Germany

[73] Assignee: Herbert Streckfuss GmbH, Eggenstein, Germany

[21] Appl. No.: 09/180,130

[22] PCT Filed: Apr. 29, 1997

[86] PCT No.: PCT/EP97/02199

§ 371 Date: Nov. 6, 1998

§ 102(e) Date: Nov. 6, 1998

[87] PCT Pub. No.: WO97/41991

PCT Pub. Date: Nov. 13, 1997

[30] Foreign Application Priority Data

May 7, 1996 [DE] Germany .......................... 196 18 227

[51] Int. Cl.[7] .................................................. B23K 31/02
[52] U.S. Cl. ...................... 228/180.1; 228/259; 228/119
[58] Field of Search .................... 228/180.1, 178, 228/39, 57, 256, 259

[56] References Cited

U.S. PATENT DOCUMENTS

| | | | |
|---|---|---|---|
| 3,721,379 | 3/1973 | Corsaro | 228/39 |
| 4,157,048 | 6/1979 | Lemmer | 83/579 |
| 4,196,839 | 4/1980 | Davis | 228/180 |
| 4,386,464 | 6/1983 | Yanai et al. | 29/834 |
| 4,659,002 | 4/1987 | Wallgren . | |
| 4,739,919 | 4/1988 | Van Den Brekel . | |
| 5,051,339 | 9/1991 | Friedrich et al. | 430/311 |
| 5,176,312 | 1/1993 | Lowenthal . | |
| 5,566,877 | 10/1996 | McCormack | 228/105 |
| 5,617,990 | 4/1997 | Thompson, Sr. | 228/180.1 |
| 5,740,954 | 4/1998 | Pai et al. | 228/40 |

FOREIGN PATENT DOCUMENTS

| | | |
|---|---|---|
| 297 827 | 3/1972 | Austria . |
| 401 01 26 | 10/1991 | Germany . |
| 431 42 41 | 11/1994 | Germany . |
| 01 232 794 | 12/1989 | Japan . |
| 01 290 293 | 2/1990 | Japan . |

*Primary Examiner*—Patrick Ryan
*Assistant Examiner*—Jonathan Johnson
*Attorney, Agent, or Firm*—Paul Vincent

[57] ABSTRACT

The invention concerns a method for soldering of additional electronic components onto a circuit board having components which have already been soldered and mounted thereto, wherein the additional components are plugged through the circuit board and soldered thereto. In order to be able to subsequently solder the components in a simple and reliable fashion, a template, having a pattern of holes corresponding to the soldering points and locations which are to be subsequently formed on the circuit board, is lowered and pressed onto the surface of a solder bath in such a fashion that the solder displaces into the holes and rises up within same. The circuit board having the previously mounted additional components is placed onto the template in such a fashion that the regions which are to be soldered are disposed within the openings of the template and dipped into the solder located therein. After this soldering process, the circuit board and the template are lifted from the surface of the soldering bath and this surface can be subsequently cleaned.

22 Claims, 7 Drawing Sheets

PROCESS FOR SOLDERING ELECTRONIC COMPONENTS TO A PRINTED CIRCUIT BOARD

BACKGROUND OF THE INVENTION

The invention concerns a method for soldering additional electronic components to a circuit board which already has soldered components, wherein the additional components are plugged through the circuit board and soldered thereto.

In order to solder electronic components to a circuit board, conventional technology has utilized the so-called feed-through mounting technique with which thin component connectors, so-called legs, are plugged from one side into holes of the circuit board and connected thereto at the rear side through the introduction of solder. Towards this end, the so-called flow solder method is normally utilized with which the liquid solder, in the form of a wave, is introduced to the rear side of the circuit board. This method has the disadvantage that the circuit board can thereby only be configured at one side.

In addition, the so-called surface mounting technique has been developed with which the components are disposed on the surface of the circuit board and soldered without having to pass through the circuit board. In this manner, the circuit board can be configured on both sides. In this case as well it is possible for the solder to be introduced using the flow solder method however the so-called reflow technique is usually utilized. Paste solder having a resin component is thereby used and therefore simultaneously serves for attaching as well as soldering the components. After introduction of the paste solder, the components are inserted therein and introduced into an oven at the position fixed by the resin component. The paste solder then melts and connects the components to the circuit board.

It is often necessary to retroactively solder additional electronic components onto a circuit board which already has electronic components introduced thereon in accordance with one of the two methods. One therefore has the difficulty, that the subsequent soldering can damage the elements which are already present on the circuit board as well as their soldered connections. This is not acceptable. The subsequently mounted components are therefore plugged through the circuit board in the above mentioned fashion and, connected to the circuit board using single soldering points and soldering regions.

Known in the art from DE 43 14 241 A1 is the effecting of individual soldering points or regions using a small soldered head on the upper exit end of which the solder, in the form of a small wave, overflows so that a so-called mini-wave is formed. It has turned out that this type of small solder head does not effect reliable soldering results, since the solder has a high affinity for oxygen so that impurities in the form of an oxidation layer are often present on the surface of the solder head. This layer is difficult or impossible to remove. In addition, it has turned out that the height of the wave has certain fluctuations. This can encroach upon the quality of the solder joint. In addition, the relatively small amount of solder can lead to an uneven solder distribution.

SUMMARY OF THE INVENTION

The soldering points or soldering regions which are to be subsequently effected are usually unevenly distributed over the circuit board. In the method mentioned, this leads to the additional disadvantage that the circuit board must either be displaced above the solder head during the soldering process, or a plurality of solder heads must be provided corresponding to the number of soldering points to be formed. In the first case, very complicated movements are required, making the method slow and not very effective and the apparatus is difficult to construct and correspondingly expensive. In the second case, the constructional effort is likewise extremely high and there is an unacceptably high risk of poor quality soldering in consequence of impurities in conjunction with the large number of soldering heads.

U.S. Pat. No. 5,176,312 proposes a device for the soldering of electronic components to a circuit board with which the upper side of the soldering bath has an attached nozzle plate having a plurality of differing nozzles which are disposed in correspondence with the points or regions which are to be soldered and through which the solder is introduced thereon using a pump. Since these nozzles have differing cross sectional shapes and diameters, introduction of the solder into the nozzles results in differing flow and pressure dependencies which are difficult to control. In addition, the nozzles, due to their narrow diameters, can easily become soiled in the above mentioned manner or blocked to encroach upon the soldering results.

A similar solution is described in AT 297 827 with which solder conducting sheet metal having holes is disposed on the upper end of a well forming the solder bath. The solder can be raised within the well using a transport device so that it rises into the holes to build convex solder caps on the upper surface thereof. The raising of the solder within the well and the holes leads to the above mentioned disadvantages with regard to difficulty of controlling the flow and pressure dependencies.

Known in the art from U.S. Pat. No. 4,739,919 is the soldering of additional electronic components onto a circuit board which already has soldered components. In order to protect same, a metal template is provided on which the circuit board is disposed in such a fashion that the elements which are already soldered are accepted in recesses of the metal template. The soldering machine passes over the circuit board on the metal template so that a plurality of metal templates are necessary for operation of the soldering machine which is very difficult and expensive. The additional components are attached to the circuit board using a wave soldering method in which a solder wave or a solder flow is introduced on that side of the metal template facing away from the circuit board and rise into openings of the metal template. This process also has the above mentioned disadvantages. In addition, the use of a metal template in the method in accordance with U.S. Pat. No. 4,739,919 is particularly difficult, since metals have a relatively large coefficient of heat expansion. When the solder comes in contact with the metal template, rapid local temperature increases are effected in the metal template as a result of which the metal template deforms so that a correct alignment of the circuit board is no longer guaranteed.

It is the underlying purpose of the invention to create a method of the above mentioned kind with which electronic components can be retroactively soldered to a circuit board in a simple and reliable fashion.

This method is achieved in accordance with the invention in that the template, having a pattern of holes corresponding to the soldering points or regions which are to be retroactively introduced onto the circuit plate, is lowered and pressed onto the surface of a solder bath in such a fashion that the solder is displaced and spreads into the openings and rises therein without overflowing. The circuit board is introduced into the template having the pre-mounted additional components in such a fashion that the regions to be soldered are disposed within the holes in the template and dip into the solder located therein, wherein the circuit board and the template are subsequently raised from the surface of the solder bath.

In accordance with the invention, the solder and the points or regions which are to be subsequently soldered are not thereby introduced using special nozzles or a mini-wave, rather a dipping procedure is proposed with which only those regions or points of the components or the circuit board are dipped into the solder bath which are to be joined with solder. Towards this end, the template is lowered onto the surface of the solder bath as a result of which those sections of the surface of the solder bath which are not intended to come in contact with the circuit board are covered. The template is thereby used to prepare a plurality of small solder surfaces into which the corresponding sections of the circuit board and of the components which are to be soldered can be dipped. Since the pressure increase in the solder bath is not generated by means of a pump, rather is effected simply through the complete area sinking of the template onto the surface of the bath, an even rising of the solder into the holes in the template is achieved.

A first embodiment of the method in accordance with the invention has turned out to be very useful in which the template is initially lowered onto the surface of the solder bath and pressed thereon as result of which the solder is displaced and rises into the openings so that the plurality of dipping baths are formed. The circuit board is then placed onto the template, wherein the regions to be soldered dip into the submersion bath. It is alternatively however possible to initially place the circuit board on the template and subsequently lower both together onto the surface of the solder bath.

In order to exclude risks from impurities due to formation of an oxidation layer on the surface of relatively small solder baths, the template is lifted from the solder bath after the circuit plate or together therewith so that the entire surface of the solder bath is once more accessible and can be cleaned in a simple fashion. Cleaning can be effected using a wiping blade or by controlled overflow. In this manner, one guarantees that the small solder baths formed on the surface by the template are also substantially free from impurities.

The method in accordance with the invention facilitates high circuit board throughput, since the individual soldering points or regions can all be simultaneously soldered without requiring a transverse motion of the circuit board. One thereby also has the associated advantage that the repetition rate is independent of the number of soldering locations. In addition, the method in accordance with the invention has turned out to be extremely reliable since, due to the material properties of the solder (density, viscosity, flow dependence), large amounts are easier to control than the small amounts of solder of prior art.

If the circuit board with the previously mounted components is equipped using the feed-through mounting technique mentioned above, the components are only disposed on that side of the circuit board facing away from the solder bath. If however the components are disposed on both sides of the circuit board using surface mounting, it can be necessary to protect those components on the circuit board at the side thereof facing the solder bath. Towards this end, an improvement of the invention provides that the template has recesses at its side facing away from the surface of the solder bath into which the components which are already mounted to the circuit board can be accepted during the soldering process. These recesses, in addition to providing protection with respect to the solder, have the additional advantage that the circuit board can be lowered deeper into the template as a result of which one guarantees that the points or regions to be soldered reliably dip into the small solder baths. In this fashion, in accordance with the invention, a relatively large dipping depth is possible, since the template also facilities covering of very tall components or mechanical elements on the circuit board using corresponding recesses or integral covering caps.

In order to facilitate the reliable and precise motion of the template between the lowered and raised positions, an improvement of the invention provides that the template be driven along a guide between a raised position separated from the surface of the solder bath and a lowered position pressed against the surface of the solder bath. The guide can thereby comprise at least two guide pins which are mounted to a housing and which engage with close tolerance in corresponding through holes of the template.

In order to effect very precise solder connections, the circuit board should be guided and positioned relative to the template by means of a guide device. The circuit board is thereby preferentially disposed on a holding frame which is guided relative to the template and can be lowered and raised relative thereto. The guide pins guiding the template relative to the solder bath, can also be used to guide the holding frame relative to the template.

In order to be able to utilize the solder bath for differing component configurations, the template is preferentially exchangeable. This facilitates a rapid and constructively simple adjustment to differing patterns of solder points to be formed. The exchangeable template has the additional advantage that the heavy, hot and expensive solder bath must not be reconfigured, since adjustment to different configurations is effected only by the exchange of the template.

When soldering electronic components, one normally introduces flux onto the surface to be covered prior to the actual soldering procedure to reduce or eliminate the surface oxidation for achieving a better soldered connection. When elements are retroactively soldered, the flux should be introduced only at those points or regions of the circuit board which are to be soldered. This can be done in a simple fashion in accordance with the invention in that the flux is sprayed with the intermediate insertion of a spray template likewise having a pattern of holes corresponding to the soldering points or regions which are to be retroactively introduced onto the circuit board. One can thereby guarantee that the flux is only introduced onto the circuit board at the desired locations. The undesirable over spray which normally condenses on the circuit board is blocked by the spray template.

A preferred embodiment provides that the circuit board be positioned above the spray template and that the flux be sprayed from below. If appropriate, the circuit board can then be pre-warmed in a conventional fashion.

Further details and features of the invention can be extracted from the subsequent description of the embodiments with reference to the drawing.

DESCRIPTION OF THE PREFERRED EMBODIMENT

The individual phases of a first embodiment of the method in accordance with the invention are shown in FIGS. 1a through 1f.

Figure 1A:
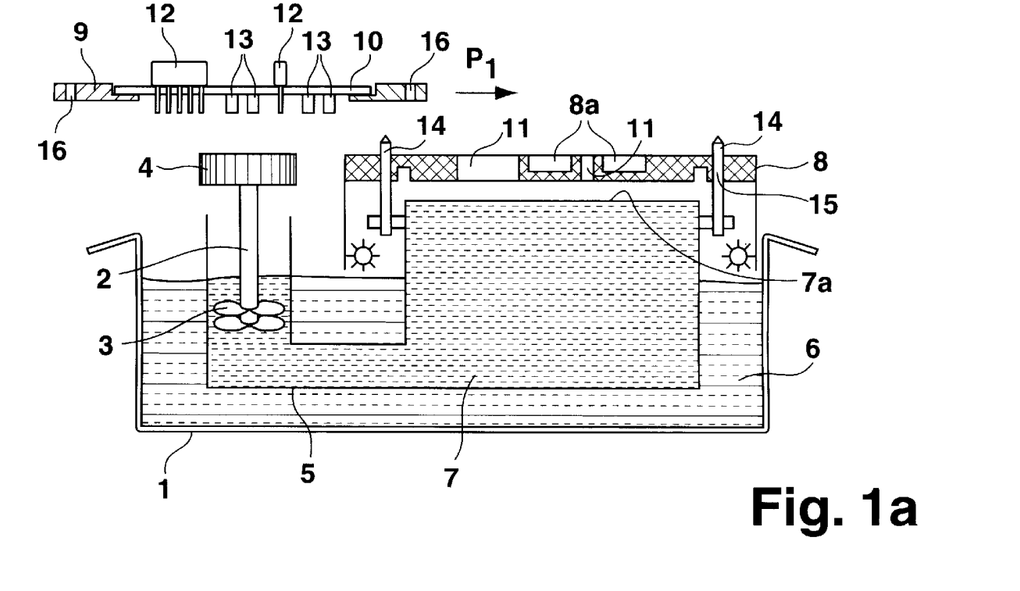
FIGS. 1*a*, 1*b*, 1*c*, 1*d*, 1*e* and 1*f* show the individual phases of a first embodiment of the method in accordance with the invention.

Liquid solder 6 is located in an outer vessel 1 in which an inner vessel 5 is inserted into which the solder can flow via inlet openings (not shown). The solder bath 7 disposed in the inner vessel 5 can be held at a predetermined defined pressure by means of a pump comprising a pump wheel 3 driven by an electrical motor 4 via a drive shaft 2, so that the surface of the solder bath maintains a predetermined desired level.

A circuit board 10, of conventional construction, is already equipped with pre-mounted and soldered components 13, so-called SMDs, using the surface mounting method. The method in accordance with the invention is then used to solder additional electronic components 12 to the circuit board 10 which are plugged through the circuit board 10 in a previous processing step (not shown), as illustrated in FIG. 1a. The circuit board 10 is placed on a holding frame 9 and is passed through differing stations of a soldering machine.

A template 8, having a plurality of openings 11, is disposed over the surface 7a of a solder bath 7 located in the inner vessel 5. The positions of the openings 11 correspond to the soldering points or regions which are to be subsequently formed on the circuit board 10 to solder components 12. The template 8 also has a plurality of recesses 8a on its surface facing away from the solder bath 7 and towards the circuit board 10 into which the components 13 which have already been soldered to the circuit board can be introduced during the soldering process. As indicated in FIG. 1a by means of the arrow $P_1$, the holding frame 9 having the circuit board 10 is initially disposed above the template 8.

Figure 1B:
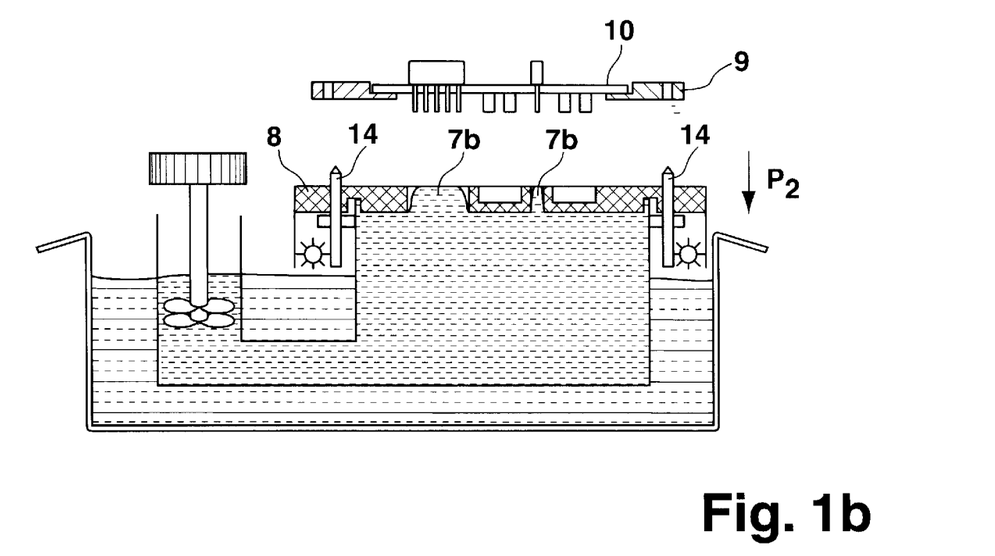

In a subsequent processing step, the template 8 is lowered out of the position shown in FIG. 1a, in which it is disposed above the surface 7a of the solder bath 7, into the surface 7a of the solder bath (arrow $P_2$) until the surface 7a of the solder bath 7 is covered and the solder in the bath 7 is pressed through the openings 11 in the template 8 to rise therein, without however overflowing (FIG. 1b). In this manner, a plurality of small solder baths 7b are formed whose relative positions correspond to the pattern of soldering points and regions to be formed on the circuit board 10. The template 8 is guided by vertical guiding pins 14 during the lowering process which are introduced on the inner vessel 5 and engage into corresponding through holes 15 of the template 8 under close tolerance.

Figure 1C:
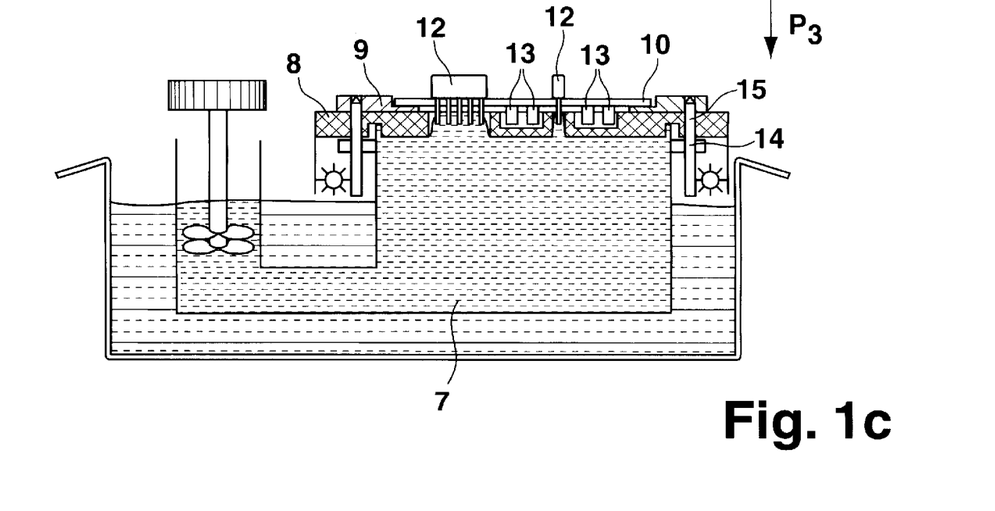
Figure 1D:
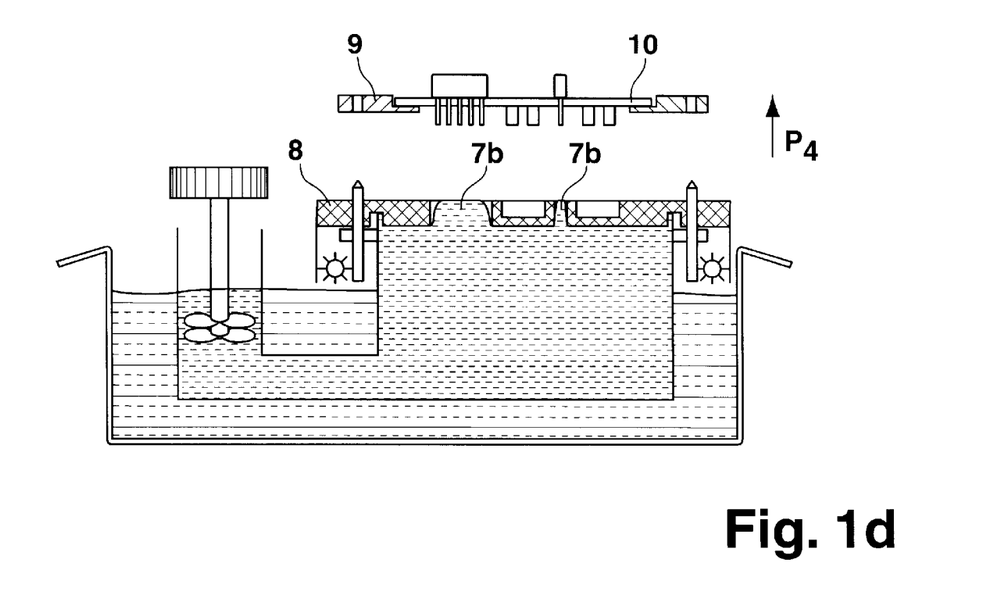

The holding frame 9 having the circuit boards 10 is subsequently lowered onto the template 8 (arrow $P_3$), wherein the free ends of the guiding pins 14 penetrating through the template 8 engage into corresponding bore holes 16 of the holding frame 9 such that the holding frame 9, with the circuit board 10 located thereon, is guided relative to the template 8 and relative to the solder bath 7. As shown in FIG. 1c, the components 13 which have already been soldered, thereby gain entrance into the recesses 8a of the template 8 and are protected in this manner. The contacts or legs of the components 12 which are to be soldered protrude in a downward direction and dip into the small solder baths 7b formed in the openings 11 of the template 8. The holding frame 9 remains in this location along with the circuit board 10 for about 2 to 3 seconds.

Figure 1E:
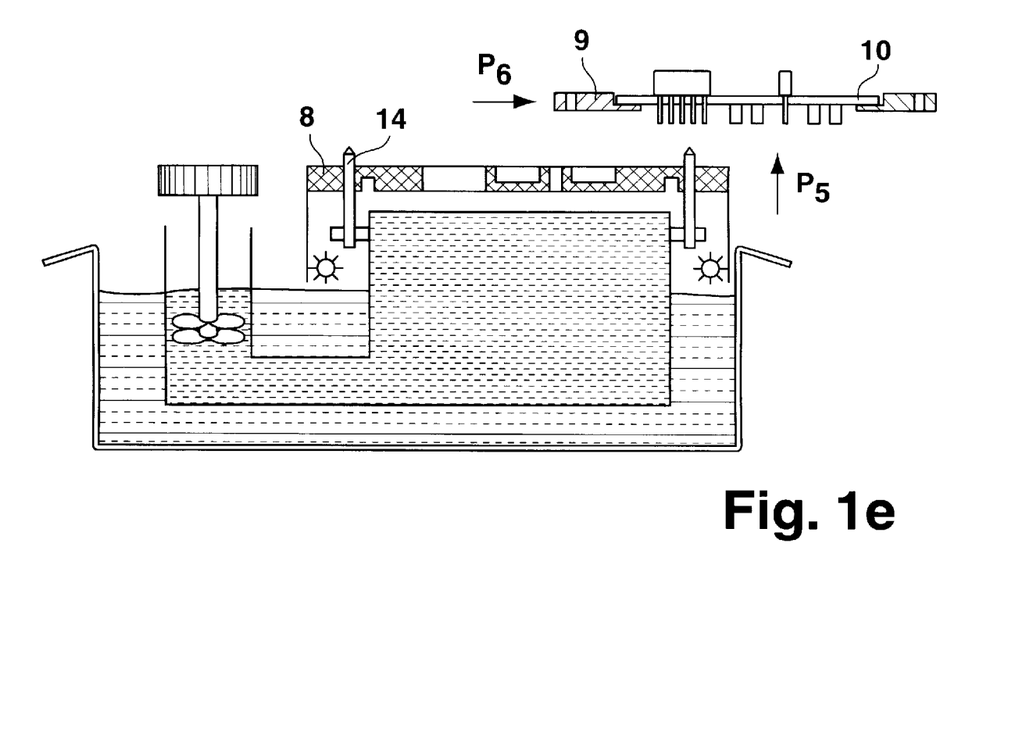
Figure 1F:
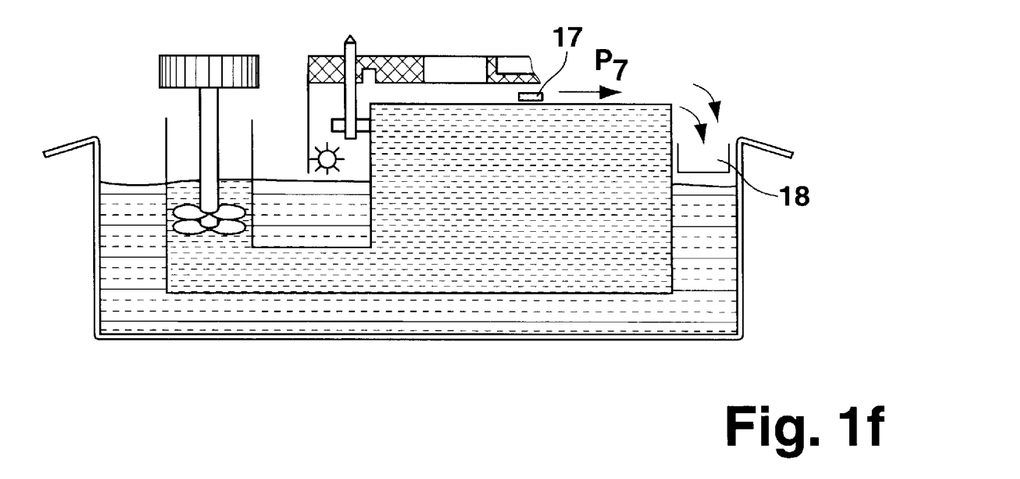

In a subsequent method step, the holding frame 9 with the circuit board 10 (arrow $P_4$, FIG. 1d) and, subsequently, the template 8 are lifted from the solder bath 7 (arrow $P_5$ in FIG. 1e). The holding frame 9 with the circuit board 10 is then transported within the machine to the next processing station (arrow $P_6$). In a final method step, the freed surface of the solder bath is cleaned by means of a wiping blade 17 to remove possible oxidation remnants (FIG. 1f), wherein the impurities are expelled into a overflow vessel 18.

Figure 2A:
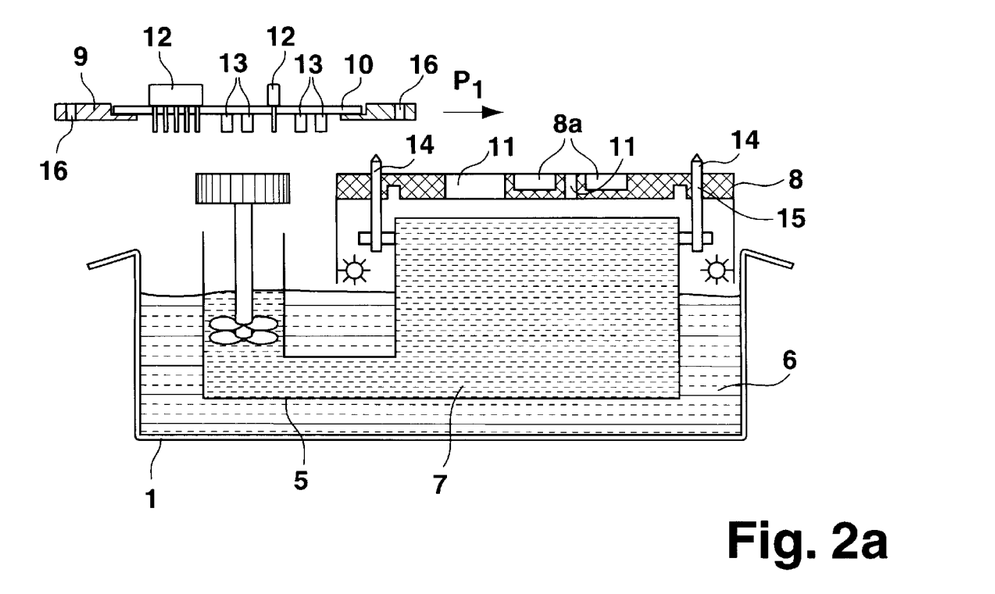
FIGS. 2*a*, 2*b*, 2*c*, 2*d*, 2*e* and 2*f* show the individual phases of a second configuration of the method in accordance with the invention.
Figure 2B:
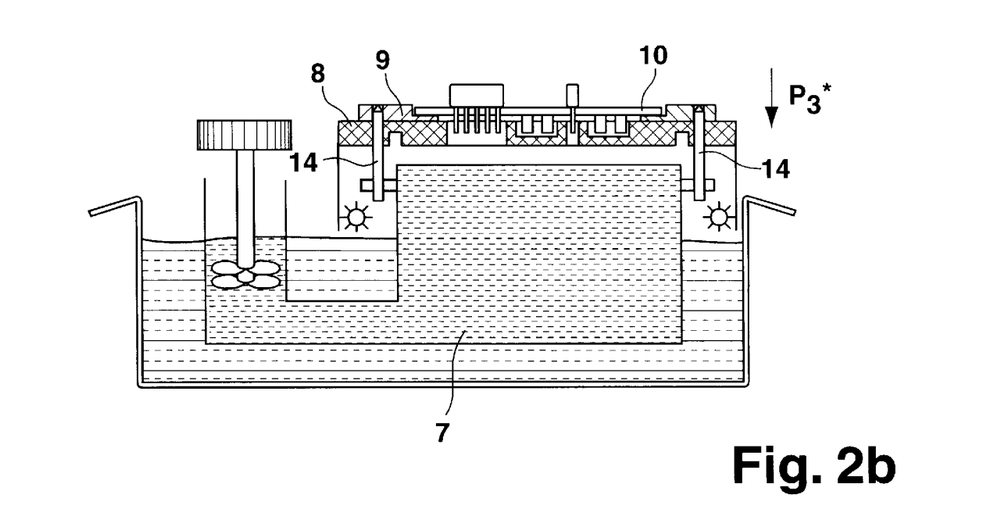
Figure 2C:
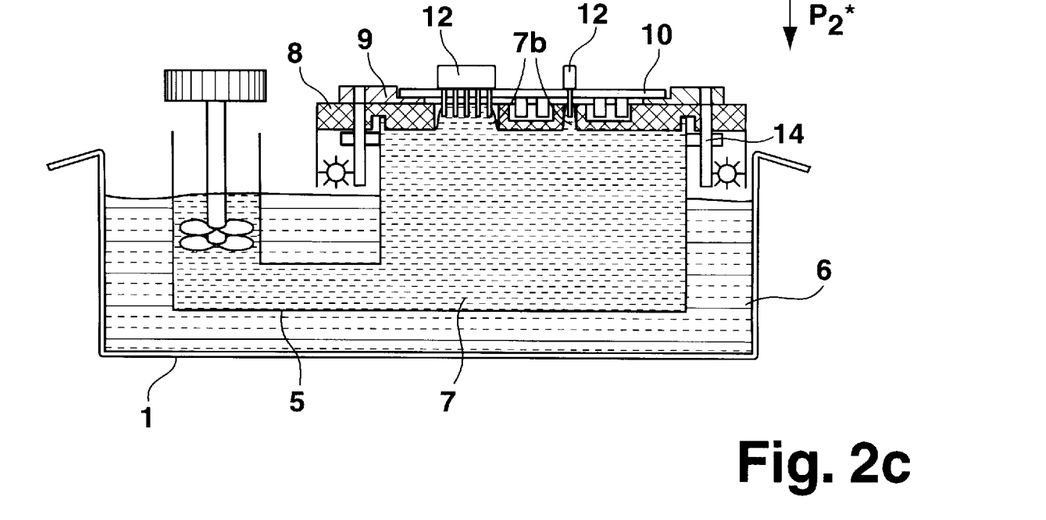
Figure 2D:
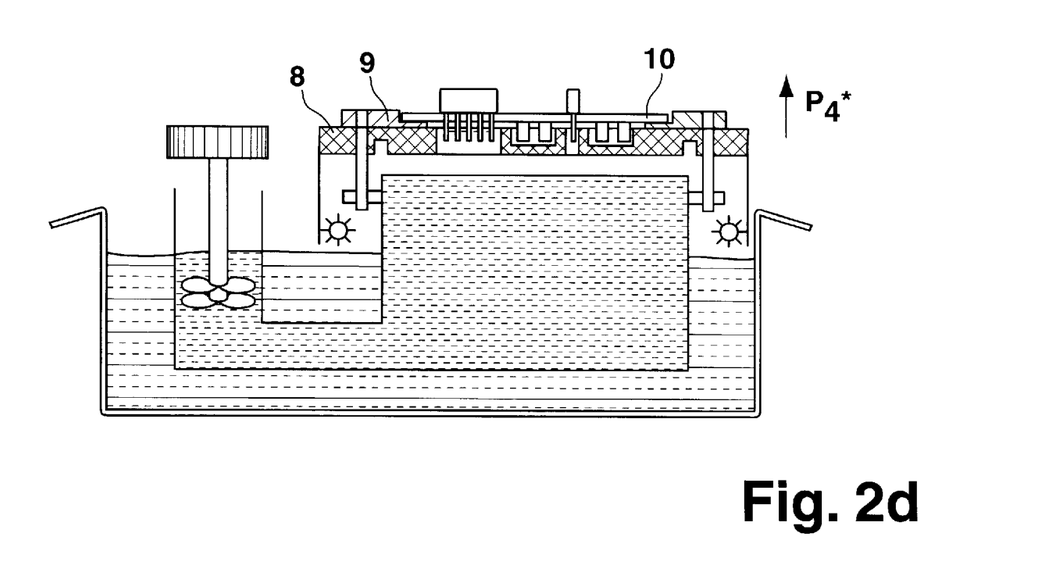
Figure 2E:
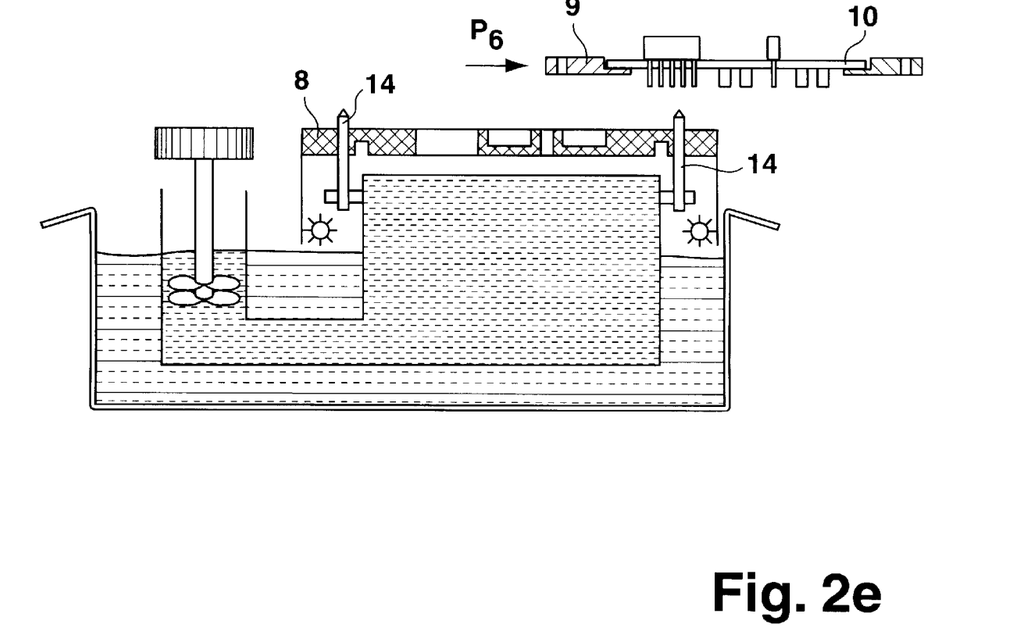
Figure 2F:
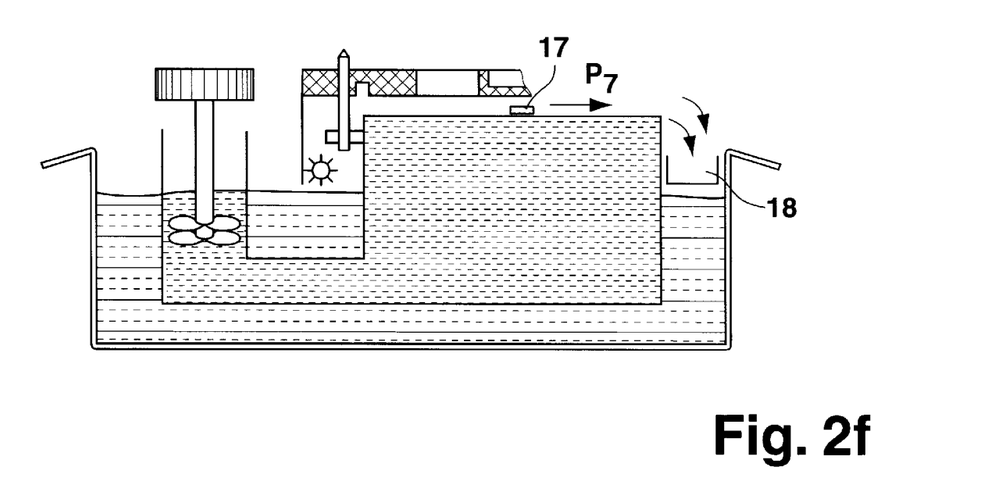

Individual phases of a second embodiment of the method in accordance with the invention are shown in FIGS. 2a through 2f, wherein these steps differ from the method in accordance with FIGS. 1a through 1f solely in that the holding frame 9 having the circuit board 10 is initially lowered onto the template 8 (FIG. 2b) before these components are mutually dipped onto the surface of the solder bath (FIG. 2c). After the soldering locations have formed, the template 8 together with the holding frame 9 and the circuit board 10 are lifted from the solder bath 7 (FIG. 2d) and, subsequent thereto, the holding frame 9 is lifted from the template 8 and led to an additional processing station. All additional processing steps have already been described in the embodiment of the method in accordance with FIGS. 1a through 1f, to which reference is hereby made.

Figure 3:
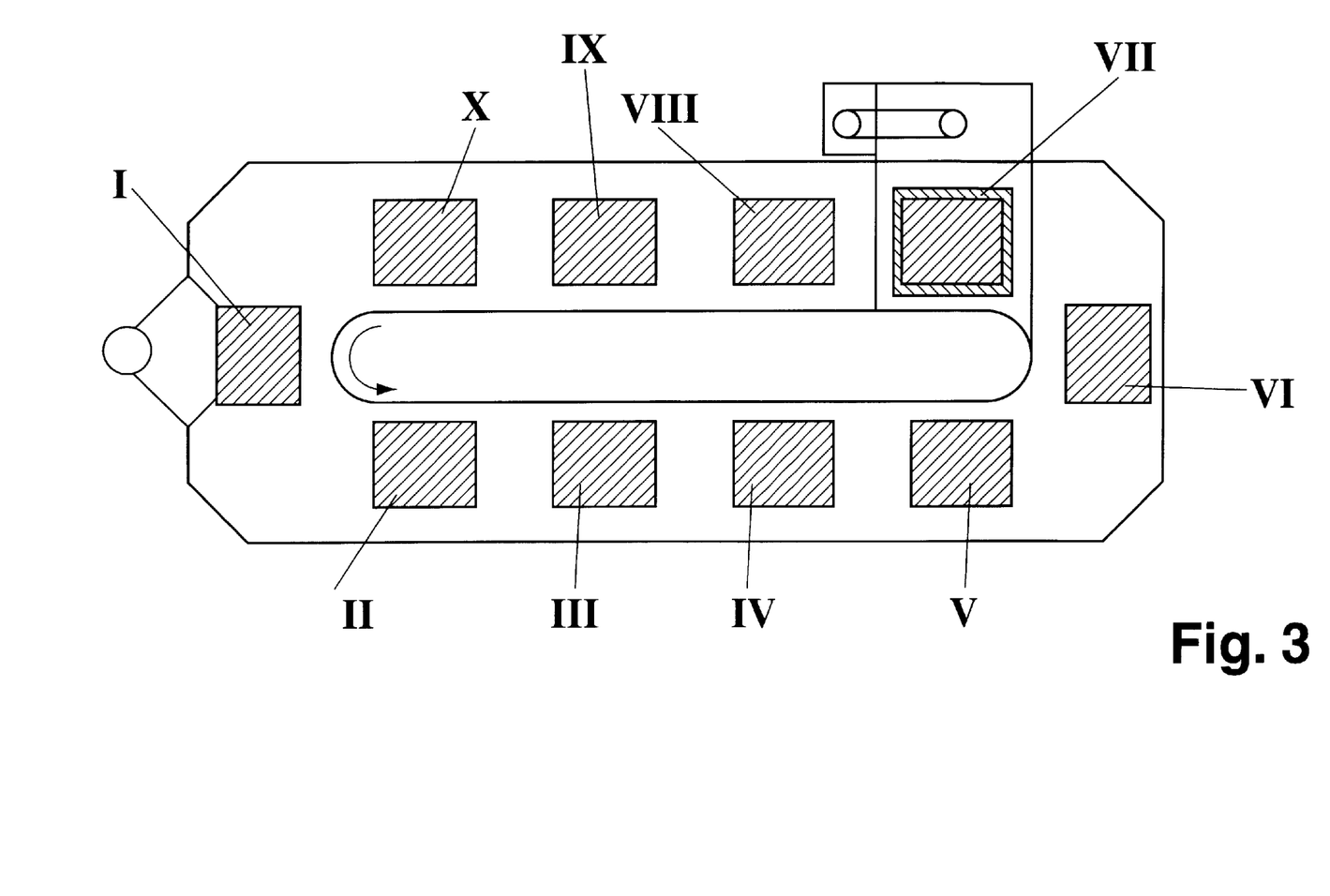
FIG. 3 shows a schematic representation of an installation for carrying out the method.

FIG. 3 shows a schematic view of a soldering installation in which the individual stations are shown. In the left station I in accordance with FIG. 3, the circuit boards are first manually or automatically placed onto the holding frames. They then pass, together with the holding frames, through the soldering installation in a counterclockwise direction, wherein flux is introduced in station II. Since the flux can only be introduced into those regions which are to be subsequently soldered, in accordance with the invention, the flux is sprayed-on with intermediate disposition of a spray template, wherein the spray template likewise has a pattern of holes corresponding to the soldering points or regions which are to be subsequently introduced onto the circuit board.

In the event that additional preparation for soldering is provided for, this can be carried out in the next station III. In the installation shown in FIG. 3, the stations IV, V and VI serve for pre-heating of the circuit board, whereas the actual soldering process transpires in station VII.

The stations VIII, IX and X facilitate a cooling of the circuit board following soldering, subsequent to which the completed soldered circuit board is once more removed from the holding frame at station I.

We claim:

1. Method for soldering additional electronic components onto a circuit board having previously soldered components, with a template having a pattern of openings corresponding to soldering points and regions which are to be soldered onto the circuit board, with a solder bath, and with means for guiding the template between a raised position above a surface of the solder bath and a lowered position pressing against the surface of the solder bath, the method comprising the steps of:

a) plugging the additional components through the circuit board;

b) lowering the template along the guiding means to press onto the surface of the solder bath, wherein solder rises into the openings c) placing the circuit board having the previously soldered components, onto the template following step b), wherein the regions which are to be soldered are disposed within the openings in the template and dip into the solder; and d) lifting the circuit board and the template from the surface of the solder.

2. The method of claim 1, wherein the guide comprises at least two guide pins.

3. The method of claim 1, further comprising means for positioning the circuit board relative to the template.

4. The method of claim 1, further comprising disposing the circuit board on a holding frame and guiding the holding frame relative to the template.

5. The method of claim 4, wherein the guide comprises at least two guide pins, the guide pins guiding the holding frame relative to the template.

6. The method of claim 1 further comprising the step of exchanging the template for another template.

7. The method of claim 1, further comprising the step of cleaning the surface of the solder bath following step d).

8. The method of claim 1, wherein the template has, on a side thereof facing away from the surface of the solder bath, recesses in which the previously soldered components are accepted.

9. The method of claim 1, further comprising the steps of positioning a spray template having a pattern of holes corresponding to the soldering points and the regions which are to be subsequently formed on the circuit board and spraying flux through the template holes onto the points and regions of the board which are to be soldered.

10. The method of claim 9, wherein the circuit board is positioned above the spray template and the flux is sprayed-on from below.

11. The method of claim 1, further comprising the step of pre-warming the circuit board.

12. Method for soldering additional electronic components onto a circuit board having previously soldered components, with a template having a plurality of openings corresponding to soldering points in regions which are to be soldered onto the circuit board, with a solder bath and with means for guiding the template between a raised position above the surface of the solder bath and a lowered position pressing against the surface of the solder bath, the method comprising the steps of:

a) plugging the additional components through the circuit board;

b) placing the circuit board, having the previously soldered components onto the template, wherein the regions which are to be soldered are disposed within the openings of the template;

c) lowering the template along the guiding means following step b) to press onto the surface of the solder bath, wherein solder rises into the openings and the regions to be soldered dip into the solder; and d) lifting the circuit board and the template from the surface of the solder.

13. The method of claim 12, wherein the guide comprises at least two guide pins.

14. The method of claim 12, further comprising means for positioning the circuit board relative to the template.

15. The method of claim 12, further comprising disposing the circuit board on a holding frame and guiding the holding frame relative to the template.

16. The method of claim 12, wherein the guide comprises at least two guide pins, the guide pins guiding the holding frame relative to the template.

17. The method of claim 12, further comprising the step of exchanging the template for another template.

18. The method of claim 12, further comprising the step of cleaning the surface of the solder bath following step d).

19. The method of claim 12, wherein the template has, on a side thereof facing away from the surface of the solder bath, recesses in which the previously soldered components are accepted.

20. The method of claim 12, further comprising the step of positioning a spray template having a pattern of holes corresponding to the soldering points and the regions which are to be subsequently formed on the circuit board and spraying flux through the template holes onto the points and regions of the board which are to be soldered.

21. The method of claim 12, wherein the circuit board is positioned above the spray template and the flux is sprayed on from below.

22. The method of claim 12, further comprising the step of pre-warming the circuit board.

* * * * *